(12) United States Patent
Mauder et al.

(10) Patent No.: US 10,854,598 B2
(45) Date of Patent: Dec. 1, 2020

(54) SEMICONDUCTOR DIODE

(71) Applicant: Infineon Technologies Austria AG, Villach (AT)

(72) Inventors: Anton Mauder, Kolbermoor (DE); Philipp Seng, Munich (DE)

(73) Assignee: Infineon Technologies Austria AG, Villach (AT)

(*) Notice: Subject to any disclaimer, the term of this patent is extended or adjusted under 35 U.S.C. 154(b) by 204 days.

(21) Appl. No.: 14/620,772

(22) Filed: Feb. 12, 2015

(65) Prior Publication Data

US 2015/0162325 A1 Jun. 11, 2015

Related U.S. Application Data

(62) Division of application No. 12/269,480, filed on Nov. 12, 2008.

(51) Int. Cl.
| | | |
|---|---|---|
| *H01L 27/06* | (2006.01) | |
| *H01L 27/07* | (2006.01) | |
| *H01L 29/872* | (2006.01) | |
| *H01L 29/868* | (2006.01) | |
| *H01L 29/861* | (2006.01) | |
| *H02M 7/06* | (2006.01) | |
| *H02M 7/219* | (2006.01) | |
| *H01L 29/16* | (2006.01) | |

(52) U.S. Cl.
CPC ...... *H01L 27/0676* (2013.01); *H01L 27/0788* (2013.01); *H01L 29/861* (2013.01); *H01L 29/868* (2013.01); *H01L 29/8611* (2013.01); *H01L 29/872* (2013.01); *H02M 7/06* (2013.01); *H02M 7/219* (2013.01); *H01L 29/1608* (2013.01); *H01L 2924/0002* (2013.01)

(58) Field of Classification Search
CPC . H01L 29/861; H01L 29/8611; H01L 29/868; H01L 29/872; H02M 7/219
See application file for complete search history.

(56) References Cited

U.S. PATENT DOCUMENTS

| | | |
|---|---|---|
| 5,063,428 A | 11/1991 | Schlangenotto et al. |
| 5,162,876 A | 11/1992 | Kitagawa et al. |
| 5,559,367 A | 9/1996 | Cohen et al. |
| 5,679,269 A | 10/1997 | Cohen et al. |
| 5,773,858 A | 6/1998 | Schlangenotto et al. |
| 6,030,904 A | 2/2000 | Grill et al. |
| 7,187,058 B2 | 3/2007 | Schmidt |

(Continued)

FOREIGN PATENT DOCUMENTS

| | | |
|---|---|---|
| DE | 10358985 | 5/2005 |
| EP | 1 638 148 | 3/2006 |

(Continued)

OTHER PUBLICATIONS

Wood et al., Integrated Power Module for Appliance Motor Drives, International Rectifier, 2002, 22 pages.

*Primary Examiner* — Raj R Gupta
(74) *Attorney, Agent, or Firm* — Dicke, Billig & Czaja, PLLC

(57) ABSTRACT

A semiconductor diode with integrated resistor has a semiconductor body with a front surface, a back surface and a diode structure with an anode electrode and a cathode electrode. A resistance layer arranged on the back surface of the semiconductor body provides the integrated resistor.

20 Claims, 7 Drawing Sheets

(56) References Cited

U.S. PATENT DOCUMENTS

| | | |
|---|---|---|
| 7,332,750 B1 | 2/2008 | Hao et al. |
| 2002/0081773 A1 | 6/2002 | Inoue et al. |
| 2003/0175411 A1 | 9/2003 | Kodas et al. |
| 2004/0080015 A1 | 4/2004 | Mauder et al. |
| 2005/0156284 A1 | 7/2005 | Schmidt |
| 2005/0161746 A1* | 7/2005 | Mauder ............... H01L 29/0834 257/370 |
| 2006/0060917 A1 | 3/2006 | Hayashi et al. |
| 2006/0255376 A1* | 11/2006 | Tolonics ............. H01L 29/0804 257/273 |
| 2007/0081280 A1* | 4/2007 | Strzalkowski .......... H01L 27/08 361/18 |

FOREIGN PATENT DOCUMENTS

| | | |
|---|---|---|
| EP | 1 870 927 | 12/2007 |
| JP | 8195479 | 7/1996 |

* cited by examiner

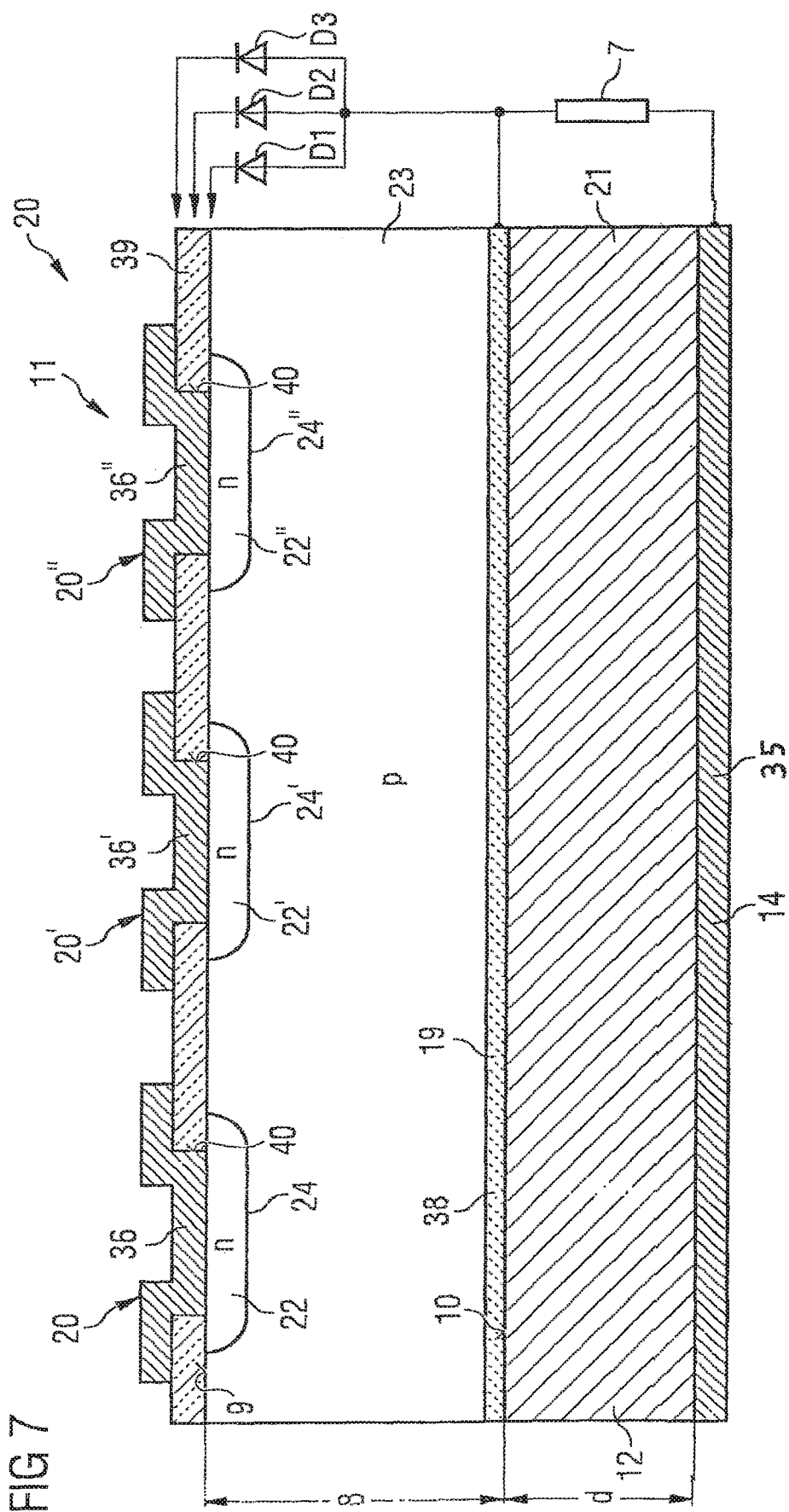

SEMICONDUCTOR DIODE

CROSS-REFERENCE TO RELATED APPLICATIONS

This Utility Patent Application is a Divisional application of U.S. Ser. No. 12/269,480, filed Nov. 12, 2008, which is incorporated herein by reference.

BACKGROUND

The application relates to a semiconductor diode, in particular a semiconductor diode with an integrated resistor.

A semiconductor diode may have an integrated resistor in which the resistor is formed as a series resistor and is stacked on the top of the semiconductor body in several layers of insulating material and conductive polysilicon placed on top of one another. However, the polysilicon resistors have to have a relatively large surface area if they are not to be exposed to thermal overload in the on phase of the semiconductor diode.

Such semiconductor diodes therefore have to have a correspondingly large surface area to accommodate a polysilicon structure on top. In addition, the multi-layer structure is cost-intensive in production, involving additional effort owing to the alternating conductive and insulating layers.

If a semiconductor diode of this type is used in switching power supplies or in converters, these power supplies or converters become significantly more expensive than the use of a discrete resistor with a discrete semiconductor diode. Such power supplies or converters for the control of motors typically include power transistors (MOSFETs, IGBTs) and gate driver circuits which adapt the signal pattern of a controller to the impedance and potential level of the power transistors. These gate driver circuits are partly at high potential on the power side, for example in half-bridge circuits, with the transistor driver connections, but must not under any circumstances transmit this potential to the controller to which they are connected on the input side.

If they are to function, the gate drivers require their own power supply in the range of 5 V to 20 V in order to switch the power transistors reliably. This can be implemented by simply for the low side gate drivers, because the ground potential forms the common reference potential in the low side region of such circuits. The supply of the high side gate drivers, however, is more difficult, as, like the corresponding power transistors, they are at high potential. As the power transistors of a bridge circuit for motors are switched on alternately and the high potential at the high side gate driver continually breaks down to ground potential, there is an opportunity to utilize the supply of the low side gate driver.

When for example the low side power transistor is gated, the high side controller is reduced to near ground potential. At this point, the low side supply potential can charge a capacitor in the high side region. When, however, the low side transistor blocks, the high side controller is at high potential and the return flow of the charge from the capacitor has to be stopped. This is usually achieved with boot-strap diodes connected between the low side and the high side supply connection. These boot-strap diodes are capable of blocking the same high voltage as the power transistors and can supply the current for the high side region.

When the circuit is switched on or the power consumption of the high side controller is high, the voltage drop across the boot-strap diode becomes unacceptably high, with the undesirable result that an excessively high peak current flows across the diode. This endangers the boot-strap diode and may trigger an adverse effect on the voltage supply and the controller. In addition, the current peaks may cause EMC (electro-magnetic compatibility) problems.

This peak current is limited by additional, mainly discrete, resistors. In the circuit, these resistors are connected in series with the boot-strap diodes in the high side region. This, however, involves increased assembly operations and material consumption, which in turn results in higher costs.

In addition, the resistance value of the resistor must not be too high if excessively high losses are to be avoided in stationary operation, in particular because the converted instantaneous power is very high. Typical values are in the range of 10Ω and 15 V supply voltage, so that more than 20 W are temporality converted in the resistor when the boot-strap diode is switched on, because virtually the entire supply voltage drops across the resistor. For typical metallic film resistors, the pulse loading is too high, resulting eventually in the failure of such a metallic film resistor owing to electro-migration or to the high thermal cyclic loading. As a result, expensive discrete power resistors are used for this purpose, although the average or continuous load is quite low.

In some methods for the production of integrated power modules, the integration of discrete resistors is only possible if special resistors are used which meet the requirements of the assembly process for semiconductors. These requirements are known to be more stringent than those applying to other commonly used printed circuit structures, which once again significantly increases the costs of such resistors. Moreover, additional space is required for these additional discrete components.

SUMMARY

A semiconductor diode includes a semiconductor body having a front surface, a back surface, a diode structure including an anode electrode, a cathode electrode and a resistance layer arranged on the back surface of the semiconductor body providing an integrated resistor. One of the anode electrode and the cathode electrode provides an electrode material of the resistance layer and entirely covers the back surface of the semiconductor diode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 7 illustrates a diagrammatic cross-section through a semiconductor boot-strap diode for the three-phase full-bridge circuit according to FIG. 6.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
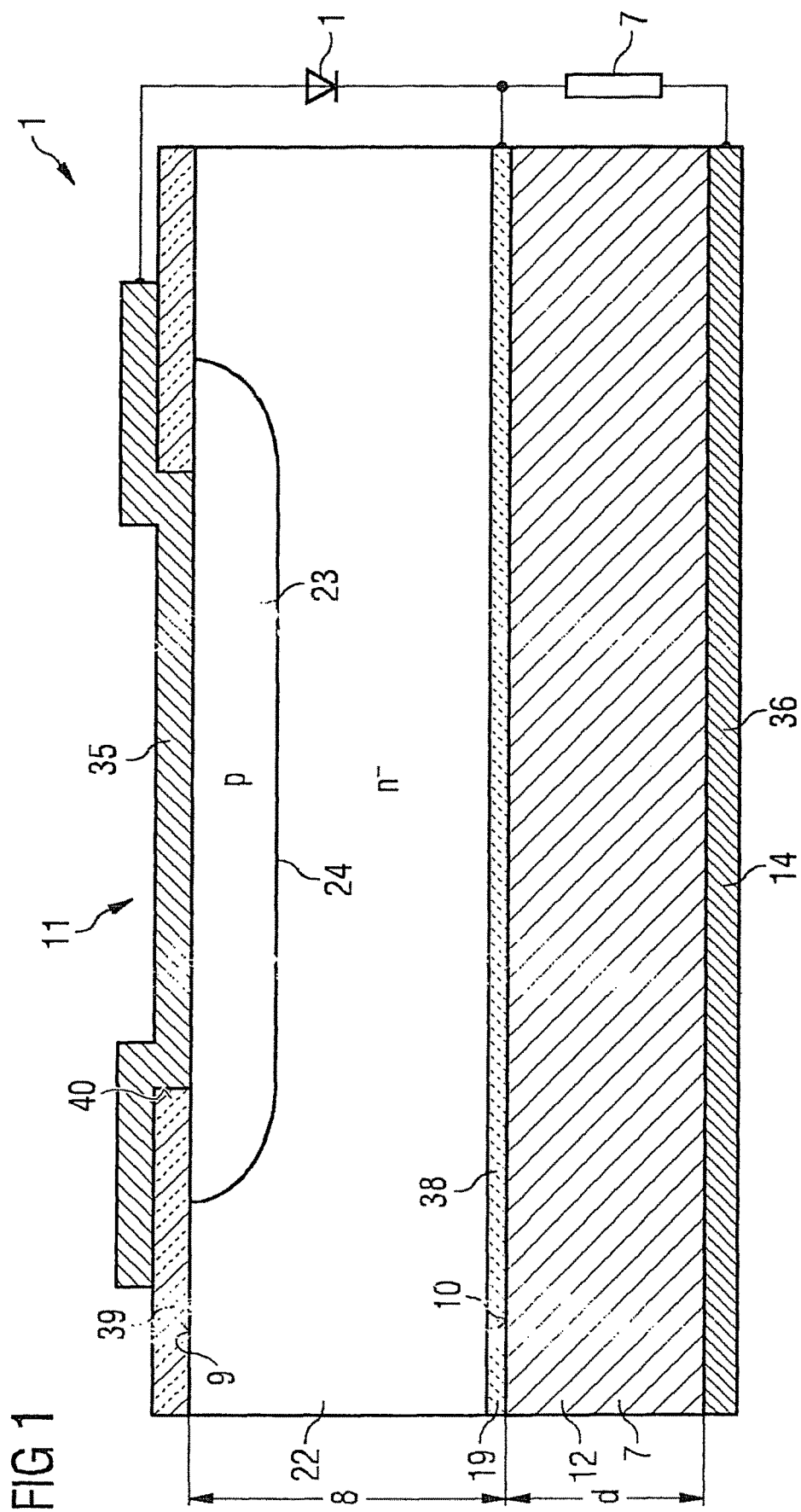
FIG. 1 illustrates a diagrammatic cross-section through a semiconductor diode.

FIG. 1 illustrates a diagrammatic cross-section through a semiconductor diode 1. The semiconductor diode 1 includes a front surface 9 and a back surface 10, with a diode emitter zone 38 located on the back surface 10 of the semiconductor body 8. This diode emitter zone 38 of the semiconductor body, which is located on its back surface 10, directly merges into a resistance layer 12, which in this embodiment is applied to the entire back surface 10 and which is towards the bottom covered by an electrode 14 of a conductive material, which covers the entire back surface of the resistance layer 12.

In this embodiment, the electrode 14 on the back is the cathode electrode 36, which is adjoined towards the semiconductor body 8 by the resistance layer 12 with a thickness d. The resistance layer 12 provides an integrated resistor 7 in resistive contact with the diode emitter zone 38 as cathode emitter zone. In this embodiment, which represents a PIN diode, this is adjoined by a lightly doped n-type drift zone 22, which together with a p-type anode zone 23 arranged in a near-surface region of the front surface 9 forms a p-n junction.

The p-type anode zone 23 is, on the front surface 9 of the semiconductor diode 1, contacted by a metal layer which forms an anode electrode 35 of the semiconductor diode 1. The contact surface of the anode electrode 35 with the p-type anode zone 23 is surrounded by an insulation layer 39, which may for example contain silicon dioxide or silicon nitride. This insulation layer 39 in particular covers the region of the front surface 9 where the p-n junction 24 reaches the front surface 9.

An n-type field stop zone 19 may be placed in front of the transitional region of the semiconductor body 8 towards the resistance layer 12 and the diode emitter zone 38. The field stop zone 19 is applied to the back surface 10 of the semiconductor body 8 before the application of the resistance layer 12. Such a field stop zone 19 serves to prevent a punch-through of the depletion zone of the p-n junction 24 to the resistance layer 12, in particular if the diode emitter zone 38 is very thin and there is therefore an increased risk that the diode emitter zone 38 may be perforated and may stop the depletion zone. A field stop zone 19 can further be used to adjust the dynamic behavior of the semiconductor diode.

As the resistance layer 12 occupies virtually the entire back surface 10 of the semiconductor diode 1, its thickness d makes a significant contribution to the volume of the semiconductor device. The volume of this resistance layer 12 provides for sufficient thermal capacity, so that most of the heat loss at the high pulse loads is buffered before the power is slowly dissipated to the environment via the housing.

The embodiment therefore provides for the integration of a resistor on virtually the whole surface of the semiconductor diode. The resistor occupies a significant part of the component volume. The overall volume of semiconductor body and resistor thus provides a sufficiently high thermal capacity, wherein most of the heat loss can be buffered at the high pulse loads before the power is slowly dissipated to the environment via the housing, which is not possible in the structure of semiconductor diode and front-integrated resistor described above.

Typical materials for the resistance layer 12 are therefore materials with a relatively high thermal capacity which are compatible with the process conditions of device manufacture, in particular in view of the fact that the resistance layer 12 is located between the metallization and the diode emitter zone 38 on the back surface 10. The thickness d of the resistance layer 12 is determined by the required thermal capacity and by its resistivity, whereby the required series resistance value is adjusted at a given overall back surface area of the semiconductor diode 1.

Typical thickness values d for the resistance layer 12 in microns lie in the range of approximately 50 µm≤d≤500 µm. Such thickness values are readily compatible with the thermal capacity requirements referred to above and with the maximum device thickness in the assembly process.

Table 1 below lists the temperature increase of an integrated resistor 7 for selected semiconductor diodes 1 with typical surface dimensions, in particular for semiconductor boot-strap diodes and an assumed charge pulse of 50 mWs (milliwatt seconds). A resistance of 10Ω is assumed for Table 1. As can be seen, a temperature increase of 38 K augments to a temperature increase of 59 K for typical geometrical data of silicon boot-strap diodes if the thickness of the resistance layer is reduced from 380 µm to 250 µm.

TABLE 1

| Thickness of resistance layer (µm) | Diode surface area (mm$^2$) | Thermal capacity (mJ/K) | Temperature increase (K) |
| --- | --- | --- | --- |
| 380 | 1.3 × 1.3 = 1.69 | 1.3 | 38 |
| 380 | 1.1 × 1.1 = 1.21 | 0.8 | 63 |
| 250 | 1.3 × 1.3 = 1.69 | 0.85 | 59 |

The diode surface areas listed in Table 1 are—without the series resistor—sufficient in 600-V-freewheeling diodes for nominal currents of approximately 3 Amperes at a maximum forward voltage of 2 V, while this current already causes a voltage drop of 30 V at the 10-Ohm-series resistor. If the production process for freewheeling diodes involves epitaxially deposited silicon on a substrate, the voltage drop in the substrate has to be as low as possible to minimize the losses of the diode.

In some embodiments, materials for the resistance layer 12 include silicon or carbon in form of graphite, because these materials have similarly high thermal capacities with respect to the volume. The temperature increase values in Table 1 relate to silicon. For carbon, they would be approximately three percent higher and would lie in the range of 39

K to 61 K in accordance with the higher specific thermal capacity $c_p$, which is 1.640 J/cm³K for silicon and 1.590 J/cm³K for carbon.

In some embodiments, carbon is used for the resistance layer 12, because carbon can be deposited economically by pyrolysis of hydrocarbons such as methane, acetylene or the like in an oven process. Carbon in the form of graphite or amorphous carbon is thermally stable and resistant against most of the chemicals used in semiconductor technology. Carbon layers can be structured simply and cost-effectively using oxygen or hydrogen plasma or oxygen- or hydrogen-based high-temperature processes. In addition, the conductivity and the resistance, respectively, of a carbon layer can be influenced by process selection and doping.

In addition, the thermal conductivity $\lambda_c$ of graphite is $\lambda_c = 16.7 \cdot 10^3$ W/cmK, which is slightly higher than that of silicon, which is $\lambda_{si} = 12.6 \cdot 10^3$ W/cmK. This difference in thermal conductivity between graphite and silicon is, however, not so important for the application of the semiconductor diode as semiconductor boot-strap diode, because, as mentioned above, continuous dissipation is low, making thermal capacity more important than thermal conductivity.

The electrode material of the resistance layer 12 also represents the back electrode 14 of the semiconductor diode 1, covering the entire back surface 10 of the semiconductor diode 1.

While the semiconductor body 8 of this embodiment is made of monocrystalline silicon, the semiconductor body 8 may also contain monocrystalline silicon carbide, which, owing to the greater band gap, permits the application of the semiconductor diode 1 in higher operating temperatures on the one hand while allowing higher blocking voltages on the other hand.

In the embodiment according to FIG. 1, the semiconductor body 8 includes at least one cathode zone 38 and at least one drift zone 22, these being n-type zones of a first conduction type, and at least one anode zone 23 of a second conduction type complementing the first conduction type. In addition, this semiconductor diode 1 includes at least one p-n junction 24 between the drift zone 22 and the anode zone 23, and the integrated resistor 7 is applied to the back surface 10 of the semiconductor body 8 in the form of a resistance layer 12. Such a semiconductor diode 1 with an integrated resistor 7 is typically used as a semiconductor boot-strap diode in the high side region of bridge circuits.

Figure 2:
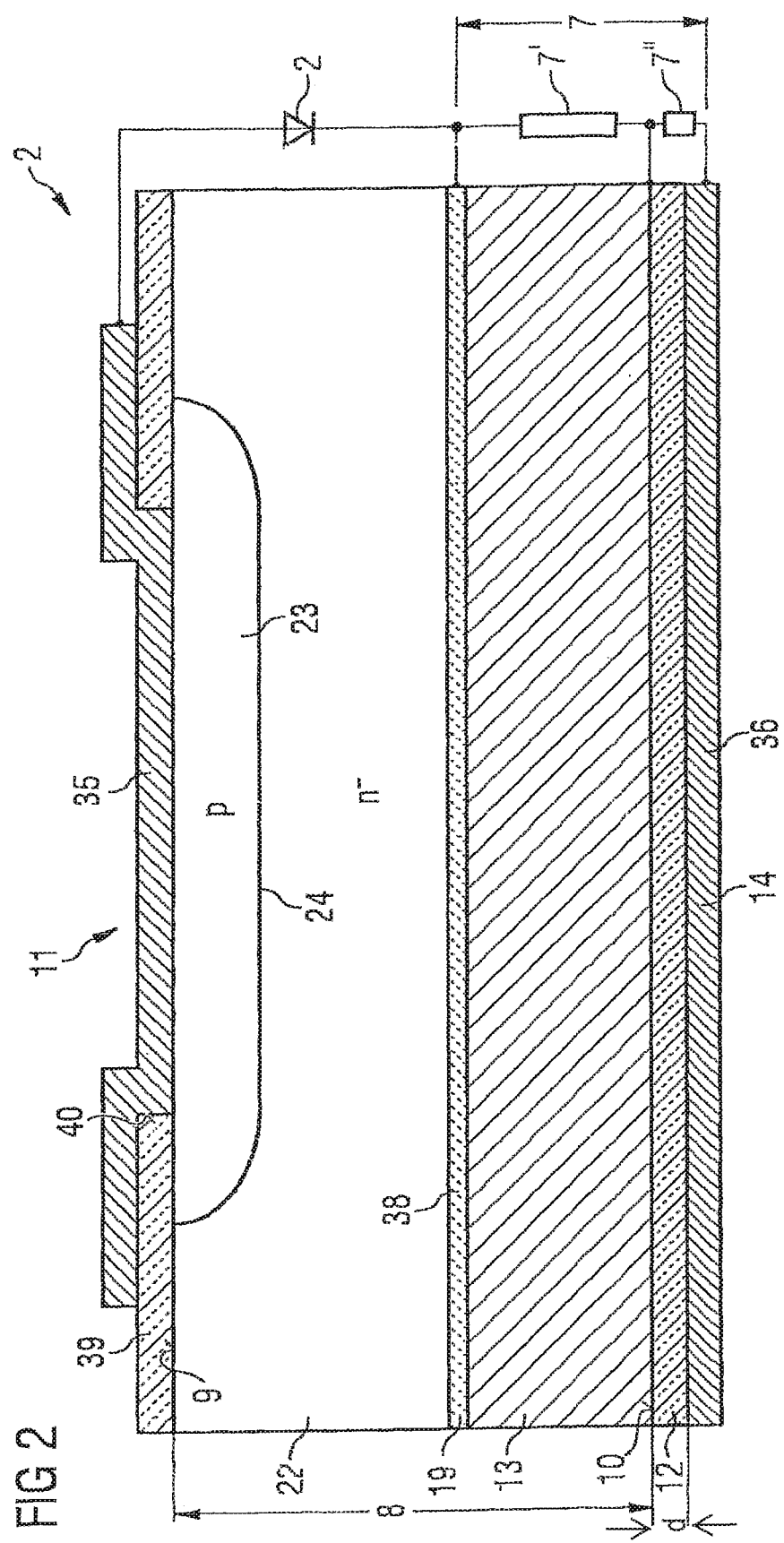
FIG. 2 illustrates a diagrammatic cross-section through a semiconductor diode.

FIG. 2 illustrates a diagrammatic cross-section through a semiconductor diode 2. Components of the same function as those in FIG. 1 are identified by the same reference numbers and not explained again below. This embodiment differs from FIG. 1 in that the resistance layer 12 is provided by a relatively thick silicon substrate 13, so that the integrated resistor 7, which is connected in series with the semiconductor diode 2, now consists of two part-resistors, these being the resistor 7' of the silicon substrate 13 and an additional resistance layer 12 with an integrated resistor 7". The thickness d of the resistance layer 12 can be reduced significantly if the substrate 13 is thick enough.

If, as the embodiment illustrated in FIG. 2, the resistor 7 is essentially provided by a silicon substrate 13, a lightly doped substrate 13 is used or a correspondingly lightly doped epitaxial layer is provided. In this context, it has to be ensured that the diode emitter zone 38 is sufficiently thick at the transition from the n-type drift zone to a substrate 13 or an epitaxial layer, so that no charge carriers are injected into the substrate 13 and there reduce the resistance value of the resistor 7 by modulating its conductivity. The diode emitter zone 38 should therefore have a minimum thickness of no less than 5 microns. A field stop zone 19 can be placed in front of the diode emitter zone 38 in the semiconductor body 8.

The use of a silicon substrate 13 as an integrated resistor 7' is typical if the n-type drift zone is an epitaxially deposited layer on a substrate 13. In this case, the substrate 13 contributes to the thermal capacity of the device, as it is in close thermal contact with the resistance layer 12. The resistance layer 12 can accordingly have a thickness d which is less than that of the embodiment according to FIG. 1. The resistance layer 12 applied to the back surface 10 of the semiconductor body 8 may consist of amorphous or polycrystalline silicon or of epitaxially deposited silicon. Any material which can be deposited on and bonded to the substrate is suitable for the formation of the resistance layer. In this case, the thickness of the substrate 13 together with the thickness of the resistance layer 12 contributes to the thermal capacity, so that the resistance layer 12 can be kept very thin if the substrate 13 is sufficiently thick.

Figure 3:
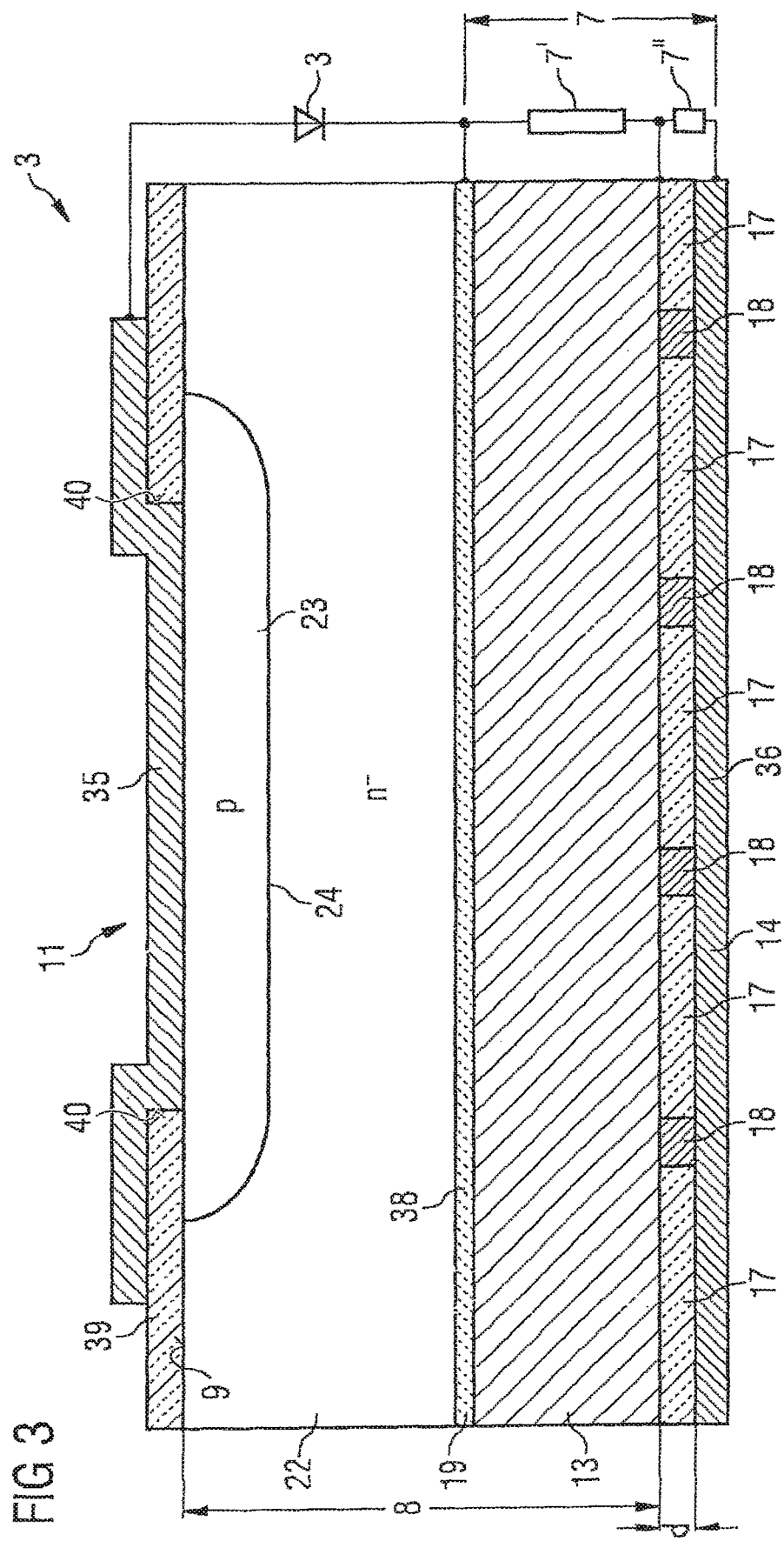
FIG. 3 illustrates a diagrammatic cross-section through a semiconductor diode.

FIG. 3 illustrates a diagrammatic cross-section through a semiconductor diode 3. Components of the same function as those in the previous Figures are identified by the same reference numbers and not explained again below. This embodiment, too, includes a semiconductor substrate 13, which provides the required thermal capacity for the semiconductor diode 3 while forming a part of the integrated resistor 7 by providing the resistor 7'.

If the substrate 13 is already dimensioned as an integrated resistor in terms of thermal capacity and resistance, the resistance layer does not have to cover the entire surface, because the heat is substantially stored in the substrate 13. This increases the freedom of design in terms of dimensioning as well as the applications for comparatively low-resistance materials for the resistance layer, so that in this embodiment isolation zones 17 of an insulating material alternate with resistance zones 18 of an electrically conductive material in the region of the resistance layer 12. The back electrode 14, which in the illustrated embodiment is a cathode electrode 36, is nevertheless applied to the entire back surface of the semiconductor device 3.

Figure 4:
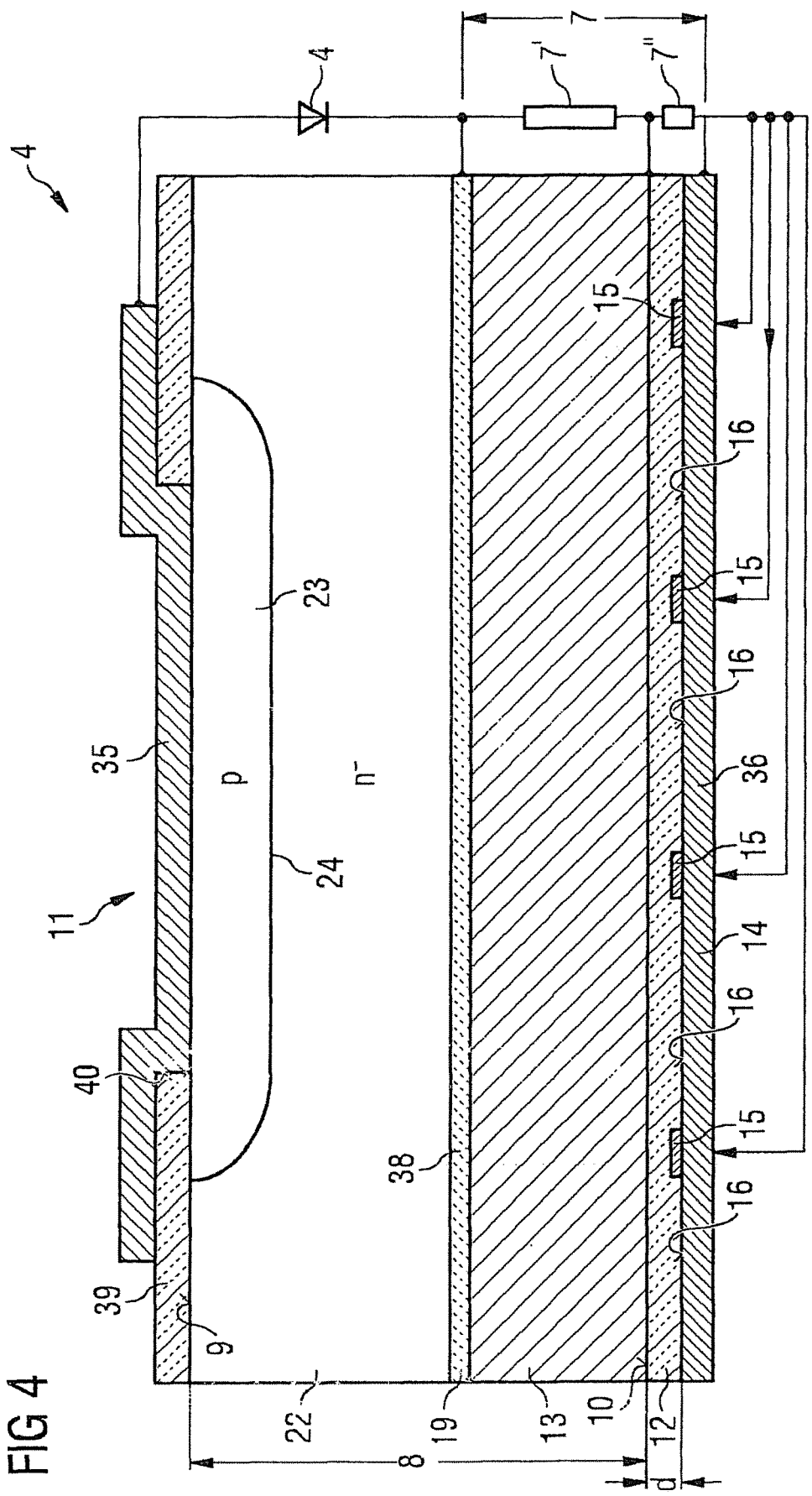
FIG. 4 illustrates a diagrammatic cross-section through a semiconductor diode.

FIG. 4 illustrates a diagrammatic cross-section through a semiconductor diode 4. This embodiment differs from the embodiments described above in that the transition from the resistance layer 12 to the electrically conductive back electrode 14, which is a cathode electrode 36 in the illustrated embodiment, only partially includes ohmic regions 15 located in a matrix of isolation regions 16. This has a similar effect on the value of the integrated resistor 7 as a whole as the alternation of isolation zones and resistance zones in the resistance layer 12 as illustrated in FIG. 3.

Figure 5:
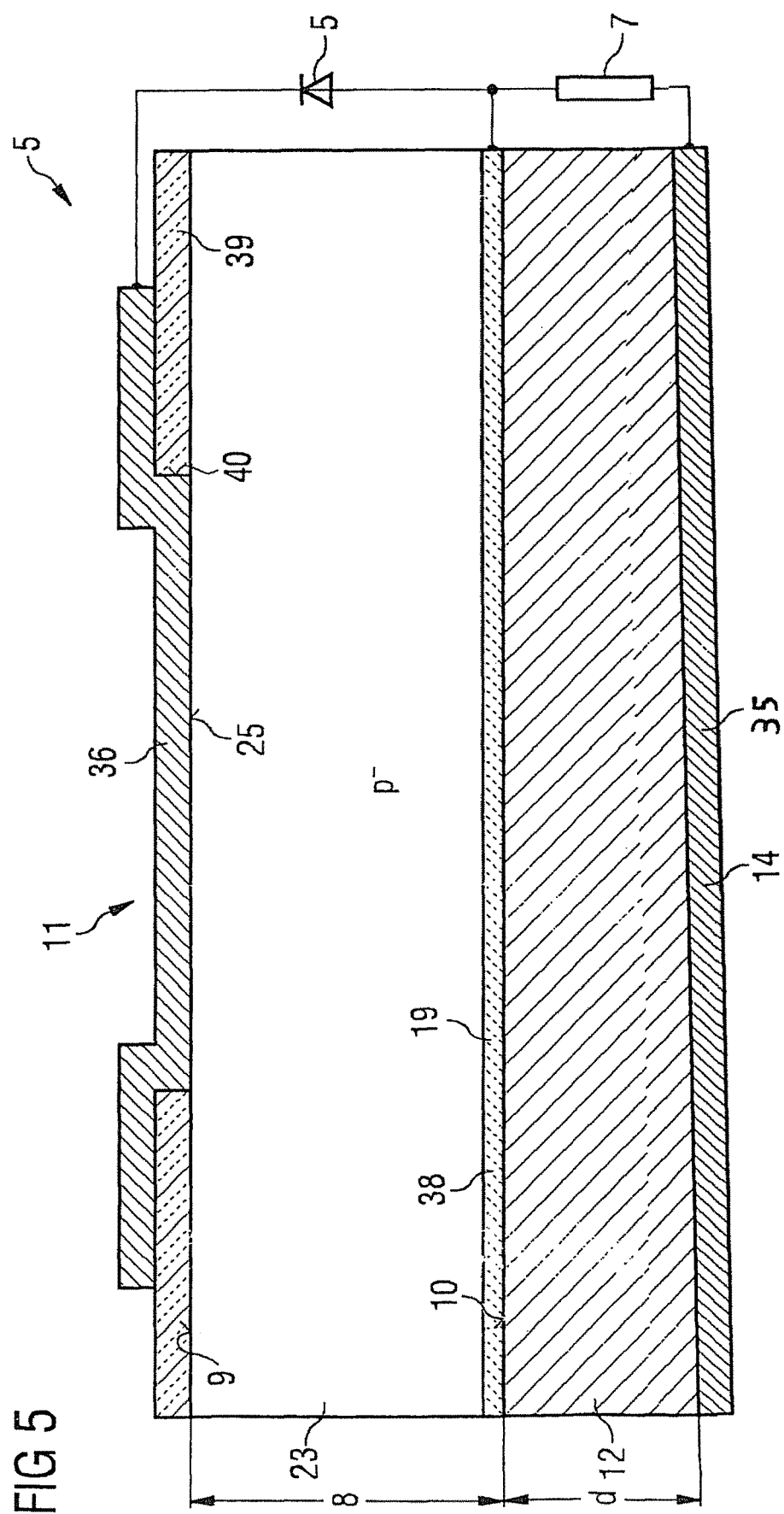
FIG. 5 illustrates a diagrammatic cross-section through a Schottky diode.

FIG. 5 illustrates a diagrammatic cross-section through a Schottky diode. The front surface 9 of the semiconductor diode 5 is provided with a cathode electrode 36 in a contact window 40. The electrically conductive material of the cathode electrode 36 is a metal which forms a Schottky junction or contact 25 with a p⁻-type semiconductor body 8. The back surface 10 of the semiconductor body 8 supports the diode emitter zone 38, on which a resistance layer 12, typically a carbon layer, is deposited, its entire surface being covered by an electrically conductive electrode 14, which is an anode electrode 35 in the illustrated embodiment. One property of the Schottky diode is the absence of a flood charge in the drift zone in the on-state, which significantly reduces the switch-off losses of the diode. In place of the conductivity types illustrated in FIG. 5 and the other figures by way of example, inverse conductivity types may be used, resulting in a corresponding inversion of the anode and cathode connections.

Figure 6:
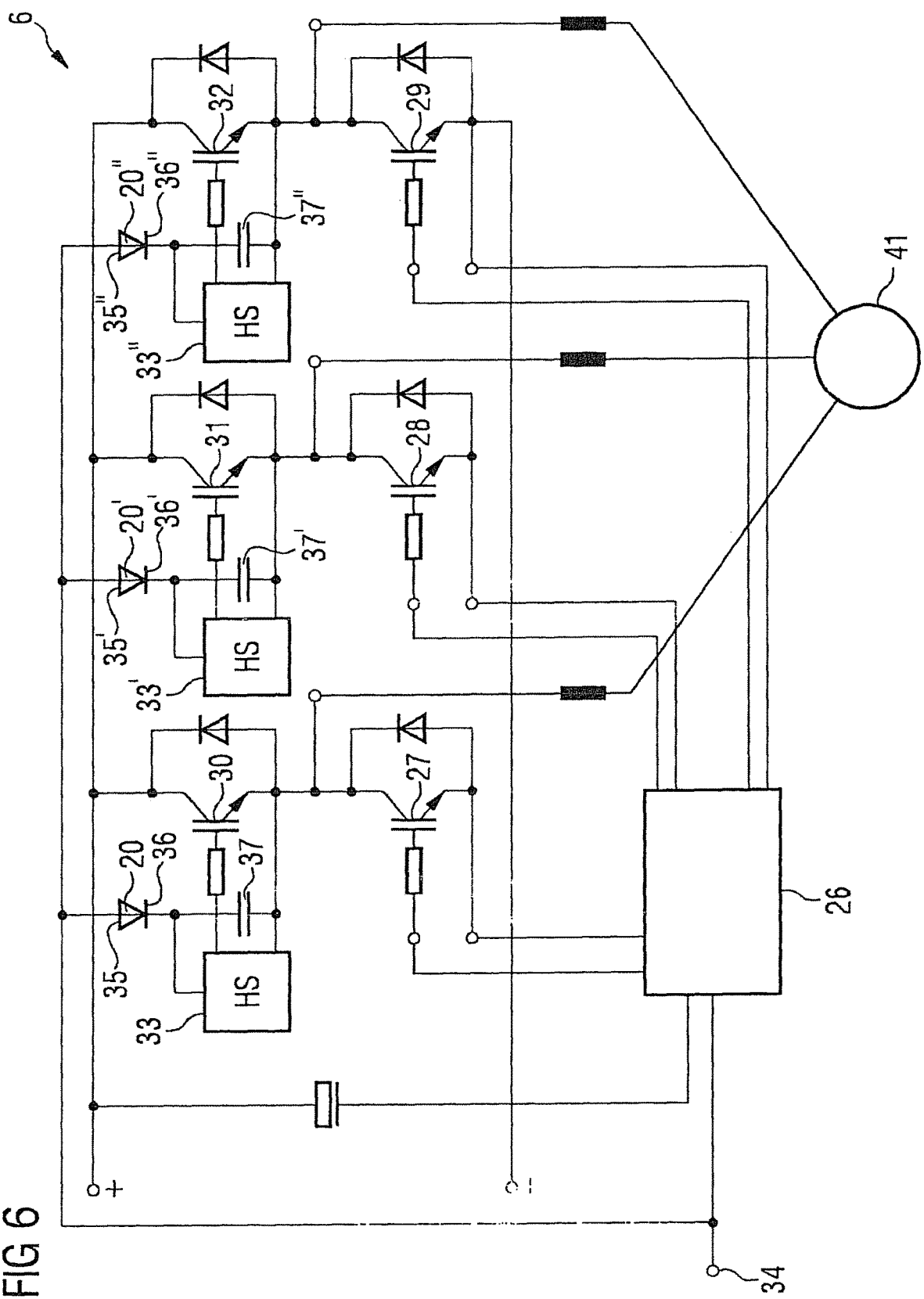
FIG. 6 illustrates a block diagram of a three-phase full-bridge circuit with semiconductor boot-strap diodes.

FIG. 6 illustrates a block diagram of a three-phase full-bridge circuit 6 with semiconductor boot-strap diodes 20, 20' and 20". Such a basic arrangement for the control of a three-phase motor 41 includes semiconductor boot-strap diodes 20, 20' and 20" for the three phases 1, 2 and 3 in the high side region HS with the high side drivers 33, 33' and 33". Via these semiconductor boot-strap diodes 20, 20' and 20" three capacitors 37, 37' and 37" are charged when the relevant point of the respective half-bridge is at low side potential.

Owing to the diode structures of the semiconductor boot-strap diodes 20, 20' and 20" of the embodiments described above with an integrated resistor in the range of 10Ω, a discrete and expensive high-voltage charge current resistor may be omitted in the high side region of the individual half-bridges. The operation of such bridge circuits with a high side power transistor 30, 31 or 32 and a low side power transistor 27, 28 or 29 has been explained above, and the special features of such a bridge circuit do therefore not have to be explained here.

As mentioned above, however, the implementation of a low side driver circuit 26 is not critical, because the low side region and the power controller 34 are always connected to ground potential. The nadir of the supply voltage of the high side drivers is pulled to a low potential via the low side power transistors 27, 28 and 29 when the low side power transistors 27, 28 and 29 reach their conducting phases. In this situation, each charge current capacitor 37, 37' and 37" can be charged via the boot-strap diodes 20, 20' and 20" with integrated resistor in order to supply the high side drivers 33, 33' and 33" during the high side phase, when the semiconductor boot-strap diodes 20, 20' and 20" are already blocked, thereby preventing the return flow of the applied charges to the power controller 34. These three boot-strap diodes 20, 20' and 20" may be integrated into a single semiconductor body as illustrated in FIG. 7.

In addition to the full-bridge circuit illustrated in FIG. 6, half-bridge circuits, i.e. circuits with a load tap between high side and low side power transistor (e.g. 30, 27) and the respective drive circuits can be used for other applications, such as switching power supplies. Two such half-bridge circuits with the load between the two taps of the half-bridge circuits are identified as full-bridge circuits. Three, four or more half-bridge circuits may be connected in a single application.

FIG. 7 illustrates a diagrammatic cross-section through a semiconductor boot-strap diode 20 suitable for the three-phase full-bridge circuit according to FIG. 6. The semiconductor body 8 is provided as a p-type drift zone, and its back surface 10 supports a common anode emitter zone, possibly with a field stop zone 19 placed in front. The p-type drift zone 23 accordingly forms three p-n junctions 24, 24' and 24" with the n-type zones 22, 22' and 22" applied as cathode zones from the front surface 9 between the drift zone 23 and the cathode zones 22, 22' and 22".

The front surface 9 is covered by an insulation layer 39 with contact windows 40 towards the cathode zones 22, 22' and 22"; three contact windows 40 are provided to contact the three cathode zones 22, 22' and 22" with a suitable electrode material. This structure of a semiconductor boot-strap diode 20 is particularly suitable for installation into the three-phase full-bridge circuit illustrated in FIG. 6. With this semiconductor boot-strap diode 20 with three cathode electrodes 36, 36' and 36" and a common anode electrode 35, all of the anode electrodes 35, 35' and 35" of the semiconductor boot-strap diodes 20, 20' and 20" in FIG. 6 are combined in a single semiconductor body 8.

The charge current capacitors 33, 33' and 33" illustrated in FIG. 6 are charged via the semiconductor boot-strap diodes of this semiconductor device, when the relevant point of the half-bridges is at low side potential. When the boot-strap diodes 20, 20' and 20" integrated into a semiconductor body and provided with their back anode electrode 35 are manufactured, they can be mounted on a single lead frame island, which makes the lead frame significantly simpler and therefore more cost-effective. As each of the semiconductor boot-strap diodes 20, 20' and 20" has a relatively small chip surface area, they can be integrated on one semiconductor chip with their back anode electrode 35 as illustrated in FIG. 7.

This integration offers the particular effect that only one continuous saw frame is required, which at individual chip surface areas of approximately one square millimeter would already occupy a significant part of the gross surface area, which is then no longer the case. The surface areas of individual chips, in particular the volume of the resistance layer 12, are partly determined by the thermal capacity at the first charging of the charge current capacitors. As the controller only switches on the next low side power transistor after a short delay time when the first capacitor has already been charged, the surface area of the semiconductor boot-strap diodes which are not in operation makes a contribution to the thermal capacity.

As a result, the resistance layer 12 may be kept thinner and the overall chip surface area may be kept smaller and thus produced more cost-effectively, because less volume is required for generating thermal capacity. As each of the semiconductor boot-strap diodes 20, 20' and 20" should have the full blocking voltage (e.g. 600 V to 1200 V), each of the semiconductor boot-strap diodes 20, 20' and 20" requires its own edge termination, so that the edge termination areas required for this purpose are retained in full size.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor boot-strap diode with an integrated charge current resistor, comprising:
   a semiconductor body having a front surface and a back surface and including a cathode emitter zone defining the back surface;
   a cathode electrode;
   a cathode zone of a first conduction type;
   an anode zone of a second conduction type;
   a p-n junction between the cathode zone and the anode zone; and
   a single unitary resistance layer disposed between the cathode emitter zone and the cathode electrode, the unitary resistance layer in direct contact with the cathode electrode and having a surface disposed on and uninterruptedly extending over the entire back surface at the cathode emitter zone of the semiconductor body and forming no p-n junction therewith, and the resistance layer providing an integrated charge current resistor where the resistance layer is in resistive contact with the cathode emitter zone.

2. The semiconductor boot-strap diode of claim 1, wherein the resistance layer contacts the semiconductor material of the semiconductor body and is coated with an electrode material forming the cathode electrode.

3. The semiconductor boot-strap diode of claim 1, wherein the semiconductor body includes a substrate which is doped more highly than the cathode zone and contributes to the thermal capacity and the resistance of the integrated charge current resistor.

4. The semiconductor boot-strap diode of claim 1, wherein the resistance layer includes carbon.

5. The semiconductor boot-strap diode of claim 1, wherein the resistance layer includes monocrystalline silicon, polycrystalline silicon or amorphous silicon.

6. The semiconductor boot-strap diode of claim 1, wherein the semiconductor boot-strap diode includes a plurality of spaced cathode zones and a common anode zone with a transition to a resistance layer arranged on the back surface.

7. The semiconductor boot-strap diode of claim 6, wherein a field stop zone is arranged between a common drift zone and the common anode zone.

8. The semiconductor boot-strap diode of claim 1, wherein the resistance layer is formed of a single material.

9. The semiconductor boot-strap diode of claim 1, wherein the surface of the resistance layer forms an interface with the cathode emitter zone.

10. A bridge circuit, comprising:
a low side driver for at least one low side power transistor, the low side driver including a power controller;
a high side driver for at least one high side power transistor, the high side driver including a capacitor providing a power supply for the high side driver; and
a semiconductor boot-strap diode including:
  a semiconductor body having a front surface and a back surface and including a cathode emitter zone defining the back surface;
  a cathode electrode;
  a cathode zone of a first conduction type coupled to a cathode electrode;
  an anode zone of a second conduction type coupled to an anode electrode;
  at least one p-n junction between the cathode zone and the anode zone; and
  a single unitary resistance layer disposed between the cathode emitter zone and the cathode electrode, the unitary resistance layer in direct contact with the cathode electrode and having a surface disposed on and uninterruptedly extending over the entire back surface at the cathode emitter zone of the semiconductor body and forming no p-n junction therewith, the resistance layer providing an integrated charge current resistor where the resistance layer is in resistive contact with the cathode emitter zone;
wherein the cathode electrode is electrically coupled to the capacitor and wherein the anode electrode is electrically coupled to the power controller via the integrated charge current resistor of the semiconductor boot-strap diode.

11. The circuit of claim 10, wherein the resistance layer contacts the semiconductor material of the semiconductor body and is coated with an electrode material forming the cathode electrode.

12. The circuit of claim 10, wherein the semiconductor body includes a substrate which is doped more highly than the cathode zone and contributes to the thermal capacity and the resistance of the integrated charge current resistor.

13. The circuit of claim 10, wherein the resistance layer includes carbon.

14. The circuit of claim 10, wherein the resistance layer includes monocrystalline silicon, polycrystalline silicon or amorphous silicon.

15. The circuit of claim 10, wherein the semiconductor boot-strap diode includes a plurality of spaced cathode zones and a common anode zone with a transition to a resistance layer arranged on the back surface.

16. The circuit of claim 15, wherein a field stop zone is arranged between a common drift zone and the common anode zone.

17. The circuit of claim 10, wherein the resistance layer is formed of a single material.

18. The circuit of claim 10, wherein the surface of the resistance layer forms an interface with the cathode emitter zone.

19. A semiconductor boot-strap diode with an integrated charge current resistor, comprising:
a semiconductor body having a front surface and a back surface and including a cathode emitter zone defining the back surface;
a cathode electrode;
at least one cathode zone of a first conduction type;
at least one anode zone of a second conduction type;
at least one p-n junction between the cathode zone and the anode zone; and
a single unitary resistance layer disposed between the cathode emitter zone and the cathode electrode, the unitary resistance layer in direct contact with the cathode electrode and forming a non-pn junction interface with the cathode emitter zone uninterruptedly extending over the entire back surface at the cathode emitter zone of the semiconductor body, and the resistance layer providing an integrated charge current resistor.

20. The semiconductor boot-strap diode of claim 19, wherein the resistance layer is formed of a single material.

* * * * *